United States Patent [19]

Mammano et al.

[11] Patent Number: 5,291,384
[45] Date of Patent: Mar. 1, 1994

[54] PHASE SHIFTED SWITCHING CONTROLLER

[75] Inventors: Robert A. Mammano, Costa Mesa, Calif.; Jeffrey D. Putsch, Milford, N.H.

[73] Assignee: Unitrode Corporation, Billerica, Mass.

[21] Appl. No.: 976,662

[22] Filed: Nov. 16, 1992

Related U.S. Application Data

[63] Continuation of Ser. No. 718,192, Jun. 20, 1991, abandoned.

[51] Int. Cl.$^5$ .................... H03K 5/04; H02H 7/122
[52] U.S. Cl. .................................. 363/17; 363/56; 363/132; 363/98
[58] Field of Search .............. 363/26, 17, 56, 132, 363/98, 72, 178; 323/235; 307/602

[56] References Cited

U.S. PATENT DOCUMENTS

| | | | |
|---|---|---|---|
| 4,061,929 | 12/1977 | Asano | 307/246 |
| 4,504,895 | 3/1985 | Steigerwald | 363/17 |
| 4,566,059 | 1/1986 | Gallios et al. | 363/17 |
| 4,586,118 | 4/1986 | Mihalka | 363/17 |
| 4,639,844 | 1/1987 | Gallios et al. | 363/17 |
| 4,685,040 | 8/1987 | Steigerwald et al. | 363/17 |
| 4,855,858 | 8/1989 | Boertzel et al. | 361/18 |
| 4,855,888 | 8/1989 | Henze et al. | 363/17 |
| 4,864,479 | 9/1989 | Steigerwald et al. | 363/17 |
| 4,912,622 | 3/1990 | Steigerwald et al. | 363/98 |
| 4,941,075 | 7/1990 | Fox et al. | 363/41 |
| 4,967,332 | 10/1990 | Claydon et al. | 363/17 |
| 5,029,064 | 6/1991 | Ball | 363/65 |
| 5,060,130 | 10/1991 | Steigerwald | 363/65 |
| 5,093,771 | 3/1992 | Harvest | 363/98 |

OTHER PUBLICATIONS

Mammano, Bob, and Putsch, Jr., "Phase-Shifted PWM Control-A New Integrated Controller Eases the Design of Efficient High-Frequency Bridge Power Switching," 1991 IEEE 6th Applied Power Electronics Conference (APEC), Mar. 10-15, 1991, Dallas, Tex., pp. 263-268.
Technical Support Package, "DC-to-DC Converter Uses Reserve Conduction of MOSFETs," NASA Tech Briefs LEW-14944, Lewis Research Center, Cleveland, Ohio, pp. 1-5.
Technical Brief related to above Technical Support Package, "DC-to-DC Converter Uses Reverse Conduction of MOSFET's," LEW-14944, Lewis Research Center, publ. in NASA Tech Briefs, Mar. 1991, p. 22.
Carsten, Bruce, "Fast, Accurate Measurement of Core Loss at High Frequencies," PCIM, Mar. 1986, pp. 29-33.
Goodenough, Frank, "Phase Modulation Cuts Large-Switcher Losses," Electronic Design, Apr. 25, 1991, pp. 39-44.
Mammano, Bob, and Putsch, J., "Fixed-Frequency, Resonant-Switches, Pulse-Width Modulation With Phase-Shifted Control," PCIM '91, 23rd International Power Conversion Conference, Sep. 22-27, 1991, Universal City (LA), Calif., pp. 77-85.
General Electric Technical Proposal, Corporate Research and Development, vol. 1, "Exploratory Development of Microelectronics Power Supply," CRD 5173.027C, Mar. 1987, Schenectady, N.Y., pp. 2-10 to 2-14.
Goldfarb, Ron, "A New Non-Dissipative Load-Line Shaping Technique Eliminates Switching Stress in Bridge Converters," copyright of Power Concepts, Inc., 1981, Proceedings of Powercon 8, D-4, pp. 1-6.
Patterson, O. D. and Divan, D. M., "Pseudo-Resonant Full Bridge DC/DC Converter," Cont. Record, Jun. 21-26 1987, 18th Annual IEEE Power Elect. Spec. Cont., VA Polytech. Inst., Blacksburg, Va., 0275-9306/87/0000-0424, pp. 424-430.

*Primary Examiner*—Steven L. Stephan
*Assistant Examiner*—Davidson
*Attorney, Agent, or Firm*—Weingarten, Schurgin, Gagnebin & Hayes

[57] ABSTRACT

A controller for controlling a resonant switching dc to dc converter. The controller has four output terminals, each of which is capable of switching one of four transistors in a bridge power stage in such a way as to accomplish zero-voltage resonant switching. The phase relationship between the switching of the four transistors of the bridge power stage which is adjustable from approximately zero to 180°, results in highly-efficient, pulse-width-modulation of the output power.

11 Claims, 6 Drawing Sheets

PHASE SHIFTED SWITCHING CONTROLLER

This application is a continuation of application Ser. No. 07/718,192, filed Jun. 20, 1991 now abandoned.

FIELD OF THE INVENTION

The invention relates to electronic power supplies and more particularly to the field of dc to dc converters.

BACKGROUND OF THE INVENTION

Dc to dc converters are used to convert a first input dc voltage to a second output dc voltage. This is frequently performed incident to generating a regulated dc voltage as the output of a power supply. Such dc to dc conversion typically involves a first conversion from dc to ac, followed by a second conversion from ac to dc. The initial conversion of dc to ac involves repeated switching of the dc input voltage at a high frequency to generate the ac voltage. Once the ac voltage has been generated, the ac voltage is transformed or transferred by a transformer, which can also provide isolation, and then is rectified and filtered to regain a dc output.

When such switching supplies were developed, it was determined that a size savings could be realized by increasing the switching rate. However, because the switching transistors were commonly forced to switch high current at high voltages, as the switching rate increased to above 500 kHz., significant switching losses occurred.

To avoid such losses, it was determined that by switching sinusoidal waveforms one could switch the transistors when either the current or the voltage was zero. This switching technique was implemented by adding an LC network to work in conjunction with the transistor switches to resonantly store and release energy, while the switching frequency was varied to control the output power. This form of controlling the switching elements is termed resonant control and with these techniques, switching frequencies could be extended to beyond one megahertz.

Such a switching arrangement however resulted in increased ohmic losses. This occurred as a result of the sinusoidal waveforms having less energy for a given amplitude than do square waveforms of the same amplitude. Because of this energy decrease it was necessary to increase the peak amplitude of the sinusoidal signal in order to convert the same amount of energy. This increase in peak current meant that the ohmic losses, which increase with the square of the current, could potentially exceed the switching losses for which the resonant switching method was developed to overcome. An additional troublesome feature of resonant switching with sinusoidal waveforms was that with a variable switching frequency, issues relating to noise and power filtering were more difficult to handle.

SUMMARY OF THE INVENTION

The invention disclosed herein relates to a phase shifted controller for controlling a resonant switching dc to dc converter using a waveform which is predominantly square but with resonant transitions. In addition, by providing power control by means of phase modulation, the switching frequency is held constant. The phase shifted controller has four output terminals, each of which is capable of switching one of the output transistors in a full-bridge power stage of a high-frequency switching dc to dc converter. More specifically, this invention provides a way of implementing lossless resonant switching by delaying the switching action of the four output transistors such that all four transistors are turned on and off under zero voltage conditions. Power control is accomplished by modulating the phase of the switching between the two half bridges of the dc to dc converter from approximately zero to 180°, corresponding to a control range of from zero to maximum output power.

DESCRIPTION OF THE DRAWINGS

These and other features of the invention are more readily understood with reference to the following description considered in conjunction with the accompanying drawings in which.

DESCRIPTION OF THE PREFERRED EMBODIMENT

Figure 1:
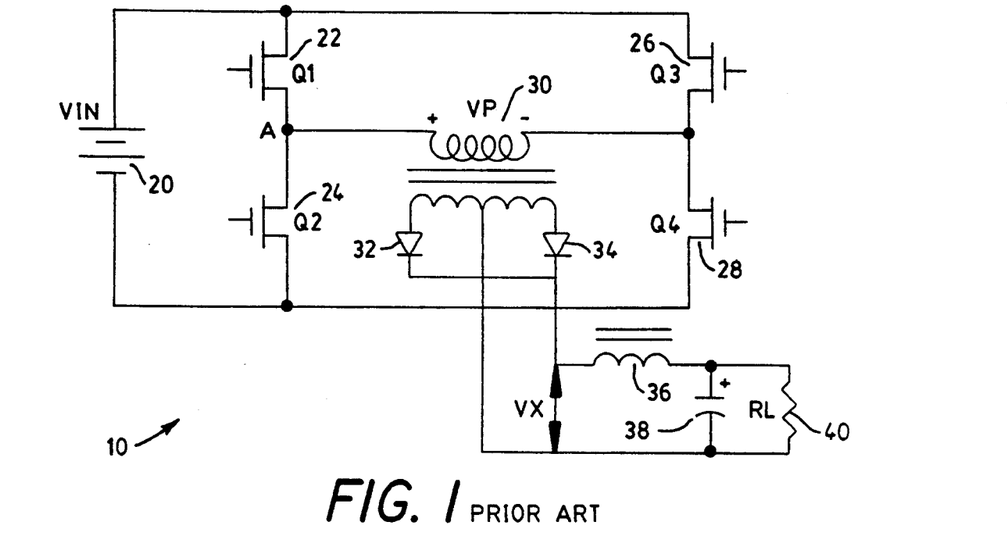
FIG. 1 is an embodiment of a dc to dc converter known to the prior art.

In brief overview, an example of the power stage of a resonant switching dc to dc converter known to the art is shown in FIG. 1. The resonant switching dc to dc converter 10 includes a dc source 20 and four switching transistors 22, 24, 26, 28. The four transistors are arranged in two groups: 22–24 and 26–28 connected in parallel across the dc source 20. The two transistors in each group 22–24 and 26–28 are connected in series. A transformer 30 has one end of a primary connected between the transistors 22, 24 of one parallel group and the second end of the primary connected between the transistors 26, 28 of the second parallel group.

Figure 1A:
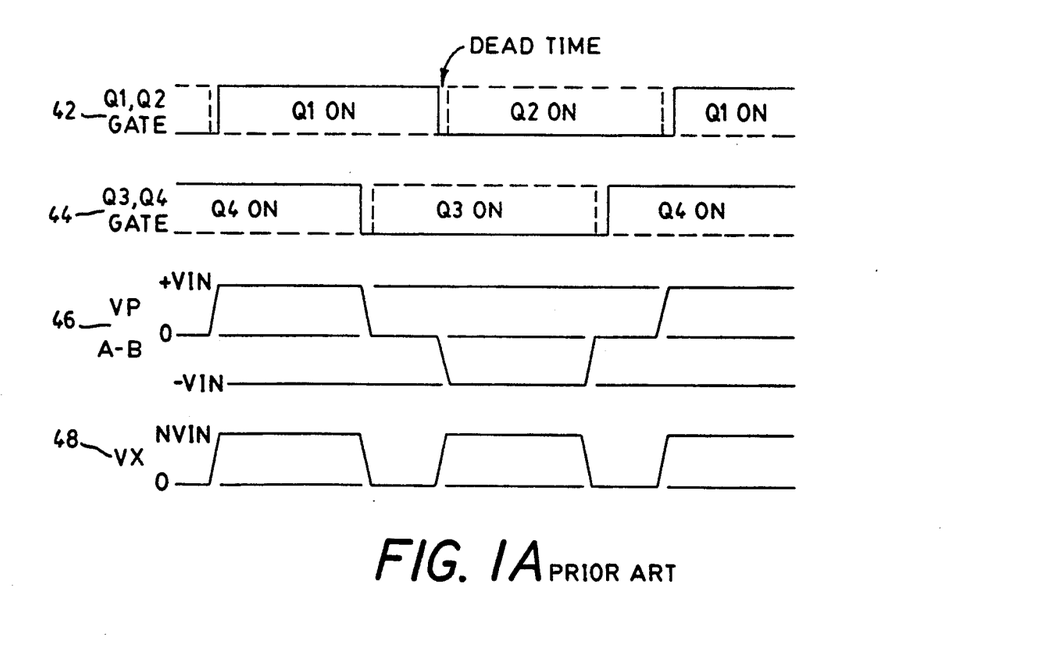
FIG. 1a is a timing diagram for the dc to dc converter shown in FIG. 1.

Referring also to FIG. 1a, during operation, alternate transistors 22, 24 and 26, 28 of each parallel group are alternately switched on and off (FIG. 1a, 42, 44). For example, in the first portion of the cycle, transistors Q1 (22) and Q4 (28) are on and Q2 (24) and Q3 (26) are off. With transistors 22 and 28 on, current flows from point A to point B through the primary of the transformer 30 producing a positive voltage (FIG. 1a, 46) and delivering power to the load. On the next portion of the cycle, transistor Q4 (28) is turned off and transistor Q3 (26) is turned on. With points A and B now at the same potential, there is no voltage across the primary of transformer 30 and no power is delivered to the load. On the third portion of the cycle, transistor Q2 (24) is switched on and transistor Q1 (22) is switched off, causing current to now flow from point B to point A through the transformer 30 producing a negative voltage (FIG. 1a, 46) and again delivering power to the load but with the opposite polarity. On the last portion of the cycle, transistor Q4 (28) is switched on and transistor Q3 (26) is switched off and again no power is delivered to the load. This switching therefore generates the ac voltage (FIG. 1a, 46) in the primary of the transformer 30. The width of the half cycles of the ac voltage is determined by the phase difference between the two half bridges. This ac voltage may be converted to a different voltage by transformer 30 and then fullwave rectified (FIG. 1a, 48) by diodes 32, 34.

This fullwave rectified dc voltage is then filtered by an inductor 36 and capacitor 38 prior to being delivered to the load, shown schematically as a resistor 40.

The above describes the use of phase control to provide pulse width modulation of output power at a fixed switching frequency. The low-loss resonant switching takes place during each switching transition illustrated in FIGS. 1b and c. The duty cycle for each alternating pair of transistors, while shown at 50% in FIG. 1a, is actually held to slightly less than fifty percent in order to provide a deadtime during which the resonant shifting of energy between the transistors takes place.

Figure 1B:
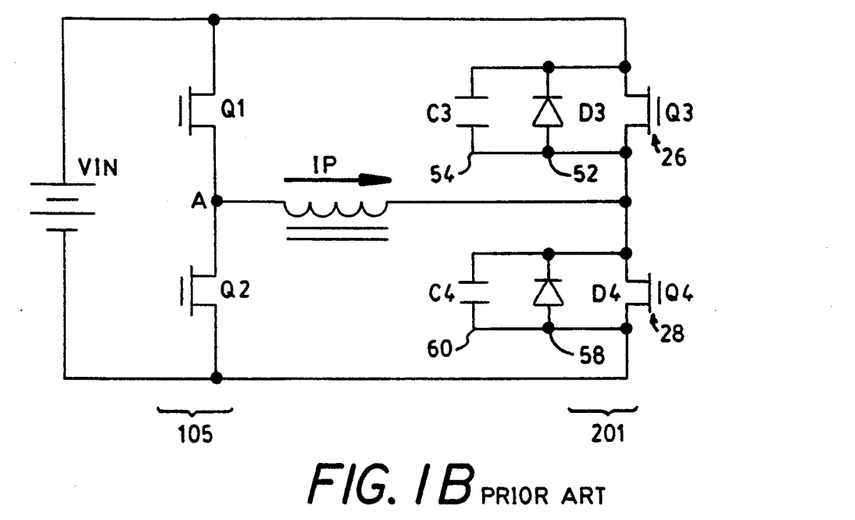
FIG. 1b is an equivalent circuit of the dc to dc converter shown in FIG. 1.
Figure 1C:
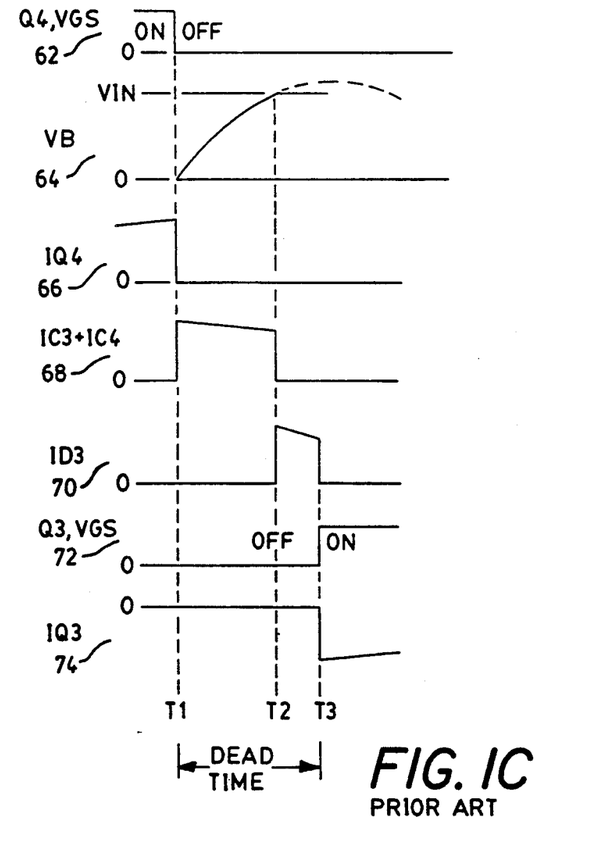
FIG. 1c is a timing diagram for the switching action of the equivalent circuit shown in FIG. 1.

FIG. 1b depicts an equivalent circuit to that in FIG. 1a, but indicates, for two of the FET transistors Q3 (26), Q4 (28), an intrinsic diode 52, 58 and a parasitic capacitor 54, 60 which is inherent in each FET Q3 (26), Q4 (28), respectively. While not drawn, these same parasitic components are present in the other two FETs 22, 24. Referring to FIG. 1c, the relationship of the intrinsic diode 52, 58 and parasitic capacitor 54, 60 and the resonant switching of the transistors can be explained.

For illustrative purposes, FIG. 1c assumes that prior to the time T1, transistors Q1 (22) and Q4 (28) are conducting, producing current flow IP (indicated by the arrow in FIG. 1b). At time T1, transistor Q4 (28) turns off (FIG. 1c, 62) preventing current flow through the transistor (FIG. 1c, 66), but the current continues to flow through the transformer primary as a result of the output impedance reflected to the primary side of this transformer. With transistor Q4 (28) off, this current then flows into the parasitic capacitors 54, 60 of the FETS Q3 (26), Q4 (28), increasing the charge on capacitor 60, reducing it on capacitor 54 (FIG. 1c, 68), and increasing the potential at point B (FIG. 1c, 64). At time T2, the intrinsic diode 52 of FET Q3 (26) is forward biased by the increasing potential at point B and conducts (FIG. 1c, 70), clamping the voltage. The conducting diode 52 thereby permits FET Q3 (26) to turn on at time T3 with a low voltage drop across it, initiating current flow in this FET (FIG. 1c, 74). The result of this action is a lossless transition of point B from a low to a high potential as current is transferred from Q4 (28), first to C3 and C4, then to D3, and finally to Q3 (26).

Similarly, when FET Q1 (22) turns off, the voltage at point A decreases until the intrinsic diode of FET Q2 (24) is forward biased. At this point Q2 (24) can be turned on with a zero voltage drop across it. It should be noted that during the Q3 (26), Q4 (28) transition, a load current was flowing in the primary of the transformer 30 and as a result, this considerable amount of current was available to cause the voltage at point B to increase rapidly. During the Q1 (22), Q2 (24) transition, points A and B are at the same potential and only the leakage and magnetization currents of the power transformer are available to cause the voltage change at point A. As a result, the time required for point A to change voltage may be longer than the time required for point B to change voltage.

Figure 2:
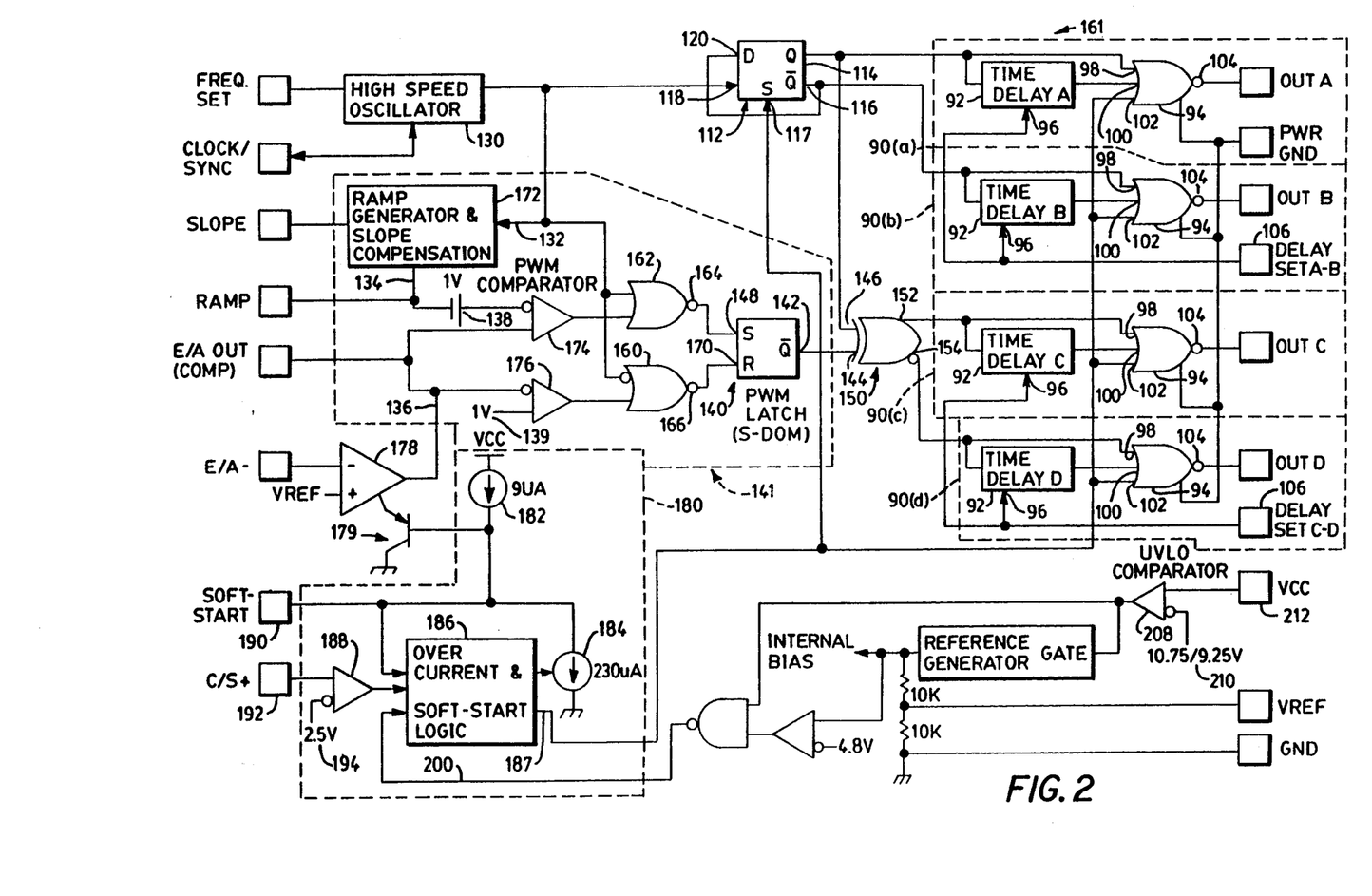
FIG. 2 is a block diagram of an embodiment of the invention.

Referring to FIG. 2, an embodiment of a phase shifted switching controller 101 for use with a resonant switching circuit such as shown in FIG. 1 includes four output stages 90(a)-90(d). Each of the four output stages 90(a)-90(d) turns on and off a corresponding one of the transistor switches 22, 24, 26, 28 of the dc-to-dc converter 10. The output stages 90 are grouped in pairs, whereby each pair drives two of the transistor switches which form a half-bridge of the dc to dc converter. For example, if the output stages 90(a) and 90(b) switch transistors Q3 26 and Q4 (28) respectively, then the output stages 90(c) and 90(d) switch transistors Q1 (22) and Q2 (24) respectively.

The first pair of output stages 90(a) and 90(b) is driven by the complimentary output signals of a toggle flip-flop 120 which is cycled by a high speed oscillator 130, the clock signal. As such, the switching frequency of the first pair of output stages 90(a) and 90(b) is fixed by the oscillator 130 with the switching transitions occurring in phase with the leading edge of each oscillator period. The second pair of output stages 90(c) and 90(d) is driven by the output signal of a pulse width modulator 141. The output signal of the pulse width modulator 141 not only provides for the alternate switching of the output stages 90(c) and 90(d) but adjusts the phasing of the switching of the second pair of output stages 90(c) and 90(d) relative to the first pair of output stages 90(a) and 90(b). It is the ability to adjust the relative phases of the switching of the pairs of transistors which provides pulse width modulation for controlling the output power.

Considering the first pair of output stages 90(a) and 90(b) first, which output stage of the first pair of output stages 90(a),90(b) is high and which is low is determined by a flip-flop 112 which has its Q output terminal connected to one output stage 90(a) and its not-Q output terminal connected to the second output stage 90(b). Therefore, only one of the output stages 90(a) or 90(b) can be high, causing the power transistor which the output stage is driving to conduct, for each state of the flip-flop 112. The flip-flop 112 has its not-Q output terminal 116 connected to its D input terminal 120 and changes state in response to the leading edge of the clock signal from the high speed oscillator 130 applied to its clock input 118. On each oscillator cycle, the flip-flop 112 changes state, deactivating one and activating the other of the output stages 90(b) or 90(a). As a result, each output stage 90 switches at half the frequency of the oscillator 130 and each output stage is on, or high, approximately 50% of the cycle time minus the amount of time of that both output stages are off, or low.

In more detail, each output stage 90 includes a time delay circuit 92 and a NOR gate 94. The signals on the Q 114 and not-Q 116 terminals of the flip-flop 112 provide the input signals to the output stages 90(a), 90(b), both directly to the NOR gate 94 of each output stage 90(a), 90(b); and by way of the delay circuit 92 of each output stages 90(a), 90(b). In each output stage 90(a) and 90(b), the output of the delay circuit 92 is a second input to the NOR gate 94. A second input 96 to the delay circuit 92 determines how much of a delay occurs between the transition of the output of the flip-flop 112 and the presence of the input signal on two of the input terminals 98, 100 of the NOR gate 94. A third input 102 to the NOR gate 94 which further controls the switching of the gate 94, will be discussed below in the context of fault condition handling.

Only when all three input signals to the NOR gate 94 are zero, is the output of the NOR gate 94, and hence the signal to the switching transistor associated with that output stage 90, high. At the time of the transition of the output signals from the output terminals 114, 116 of the flip-flop 112 to low (zero) (and hence the transition of the output 104 of the corresponding NOR gate 94 to high), the delay circuit 94 introduces a finite delay and thereby delays the turning on of the NOR gate 94 output. However, at the transition of the signals on the output terminals 114, 116 to high (and hence the output 104 of the corresponding NOR gate 94 to low), the delay circuit 92 is effectively bypassed. That is, it is only necessary for one input 98 of the NOR gate 94 to switch to high, to cause the immediate transition of the NOR gate 94 to low. This results in a delayed turning on but an immediate shutting off of the transistor switch attached to the corresponding output stage 90.

The second pair of output stages 90(c), 90(d) are identical in implementation to that described for output stages 90(a), 90(b) above, except that their inputs are derived from the pulse width modulator 141. In detail, a ramp waveform signal 134 from a ramp generator 172, which is triggered by the clock signal 132 from the high speed oscillator 130, is the input signal to a pulse width modulation (pwm) comparator 174, though a bias voltage 138. The other input of the pulse width modulation (pwm) comparator 174 is the output error signal 136 from an error amplifier 178. When the biased ramp signal, which is equal to the ramp waveform signal generated by the ramp generator 172 plus the bias voltage 138, exceeds the value of the error signal 136 from the error amplifier 178, the pwm comparator 174 changes state.

If the reset transition of the biased ramp signal voltage to its low voltage limit is considered to be the start of a control pulse, the end of the control pulse occurs when the biased ramp signal voltage rises to equal the error signal 136 from the error amplifier 178. At this point, the output from pwm comparator 174 goes low and remains in that state until the ramp signal voltage goes low again. Therefore, the pwm comparator 174 generates a pulse whose width varies proportionally to the error signal 136 from the error amplifier 178. So, as the error signal 136 from the error amplifier 178 varies, the width of the control pulse to the pwm comparator 174 will vary. This means that the switching of the output stages 90(c) and 90(d) occurs at the trailing edge of the signal from the pulse width comparator 174.

The bias voltage 138 is present because, while the ramp waveform voltage from the ramp generator 172 may go to zero, the error amplifier 178 can not generate a error signal 136 which is zero. Therefore, the ramp waveform voltage from the ramp generator 172 is biased to permit the error signal 136 from the error amplifier 178 to be driven to a value less than the minimum biased ramp signal voltage applied to the PWM comparator 174. This permits the pulse width of the control pulse from the pwm comparator 174 from go to zero when necessary.

When the control pulse width to the pulse width modulation comparator 174 is either 0% or 100% of the oscillation clock cycle, the output stages 90(c) and 90(d), if driven from a conventional PWM design would stop switching. However, with the other output stages 90(a) and 90(b), switched directly by the high speed oscillator 130, continuing to switch, this is an unacceptable condition, and additional circuitry is present to prevent its occurrence.

It is easiest to understand the circuitry by considering how the pulse width modulation circuitry responds in each of the four operating regions in which it functions. These four regions are: the region of 0 degrees of phase shift; the region of minimum controllable phase shift in which the amount of phase shift, is a function of the clock pulse width; the region of linearly controllable phase shift; and the region of 180 degrees of phase shift.

Considering these operating regions individually, when the error signal 136 from the error amplifier 178 is less than one volt, the output of the PWM comparator 174, which has the error signal 136 as one of its input signals, is low, because of the one volt bias on the ramp signal voltage on its other input terminal. Conversely, the output of a second comparator 176, which has the error signal 136 as one of its input signals and a one volt reference voltage 139 as the other of its input signals, is high.

The presence of a high signal from the second comparator 176, on one of its input terminals, causes the output 166 of a NOR gate 160 to remain low regardless of the signal at its other input terminal. The presence of the low output signal from the PWM comparator 174 on one input to a NOR gate 162 permits the output 164 of the NOR gate 162 to vary inversely with its other input signal, which is the clock signal from the oscillator 130. The presence of a low signal 166 from the NOR gate 160 on the reset input 170 of a PWM latch 140 and the varying inverse clock signal on the set input 148 of the PWM latch 140 causes the not-Q output 142 of the PWM latch 140 to go low. Therefore, the output 152 of an exclusive-OR gate 150, which has the not-Q output 142 of the PWM latch 140 as one input and the Q output 114 of the flip flop 112 as its other input, is identical to the Q output 114 of the flip-flop 112. The complementary output 154 of the exclusive-OR gate 150 is likewise identical to the not-Q output 116 of the flip-flop 112. Therefore, output stages 90(a) and 90(c) are switched in phase and output stages 90(b) and 90(d) are switched in phase, i.e. with zero phase difference.

When the error signal 136 of the error amplifier 178 is greater than one volt, but less than the biased ramp signal voltage, the output signals from both the PWM comparator 174 and second comparator 176 are low. As a result of one of its input signals being low, the output signal 164 from the NOR gate 162 is the inverse of the clock signal from the oscillator 130 which is applied to its other input terminal. Similarly, the output signal 166 from the NOR gate 160, having the inverse of the clock signal as one input and the low output from the comparator 176 as its other input, is identical to the clock signal from the oscillator 130.

With the output signals 164,166 from the two NOR gates 162,160 as inverse input signals to the set 148 and reset 170 input terminals, respectively, of the PWM latch 140, the output signal from the not-Q output 142 of the PWM latch 140 follows the clock signal from the oscillator 130. As a result, the output signal 152 from the exclusive-OR gate 150 makes a state transition on the falling edge of the clock signal from the oscillator 130 but otherwise following the Q output 114 of the flip-flop 112. This results in the minimum non-zero phase shift between pairs of output stages i.e. 90(a),90(c) and 90(b),90(d) and is equal to (360 degrees/2) * (oscillator clock frequency) * (oscillator clock pulse width).

When the error signal 136 from the error amplifier 178 is greater than the minimum biased ramp signal voltage and less than the maximum biased ramp signal voltage, the output of the PWM comparator 174 toggles between high and low values. When the error signal 136 from the error amplifier 178 exceeds the biased ramp signal voltage, the output of the PWM comparator 174 is high. Likewise when the error signal 136 is less than the biased ramp signal voltage, the output of the PWM comparator 174 is low. The output of the second comparator 176 remains low at all times.

Under these conditions, the output 164 of NOR gate 162 is low whenever the error signal 136 is greater than the biased ramp signal voltage, and high whenever the error signal 136 from the error amplifier 178 is less than the biased ramp signal voltage. The output 166 of NOR gate 160 is a copy of the clock signal from the oscillator 130. The combination of the low signal 166 from the NOR gate 160 on the reset terminal 170 of the PWM latch 140 and the varying clock signal on the set terminal 148 of the PWM latch 140 forces not-Q output 142 of the PWM latch 140 to toggle high on the rising edge of the clock signal, and to toggle low when the biased ramp signal voltage first exceeds the error signal 136 from the error amplifier 178.

As a result, the output signal 152 of the exclusive-OR gate 150 makes a transition on the falling edge of the not-Q output 142 of the PWM latch 140. This switching occurs when the biased ramp signal voltage exceeds the error signal 136 from the error amplifier 178. Therefore, at the start of each clock cycle, the Q output 114 of flip flop 112 will make a transition (for example, to a high state) and then some time later as determined by the phase shift introduced by the error signal 136, the biased ramp signal and the PWM circuitry, output 152 of the exclusive-OR gate 150 will make a transition to the same state (in this example, the high state) that the Q output 114 of the flip-flop 112 just previously entered.

Finally, when the error signal 136 is greater than the maximum biased ramp signal voltage, the output of the PWM comparator 174 is always high and the output of a second comparator 176 is always low. Under these conditions, the output signal 164 of NOR gate 162 is held low, and the output 166 of NOR gate 160 is a copy of the clock signal from the oscillator 130. Therefore the not-Q output 142 of the PWM latch 140 is held high independent of the clock signal, and output 152 of the exclusive-OR gate 150 now varies as the inverse of the Q output 114 of the flip-flop 112; resulting in the maximum 180 degrees of phase shift.

The phase shifted switching controller 101 also includes the usual circuitry 180 for handling startup and fault conditions. It should be noted, however, that the startup and fault circuitry 180, which includes over-current and soft-start logic 186, generates a high fault signal 187 upon the detection of an over-current fault. This high fault signal is the third input signal 102 to each of the NOR gates 94 of the output stages 90(a)-90(b). The presence of a high fault signal immediately turns off all the output stages 90 as discussed previously. The over-current and soft-start logic 186 also includes a fault latch which prevents the fault signal 187 from immediately disappearing once the output stages 90 have stopped switching, removing the source of the over-current fault.

Considering the delay circuit 92 and the NOR gate 94 of the output stage 90 in more detail (FIG. 3), transistors 262, 264, 266, 268 of the NOR gate 94 form a high speed totem-pole circuit which is capable of supplying or sinking more than one amp within approximately 30 nanoseconds. Transistor 268 is held on by a self-biasing driver formed by transistors 270, 272, 274 while the power supply is below its turn-on threshold or when a current fault 102 is detected. Once the power supply has reached its turn-on value, transistor 268 turns off permitting the output to go high.

Figure 3:
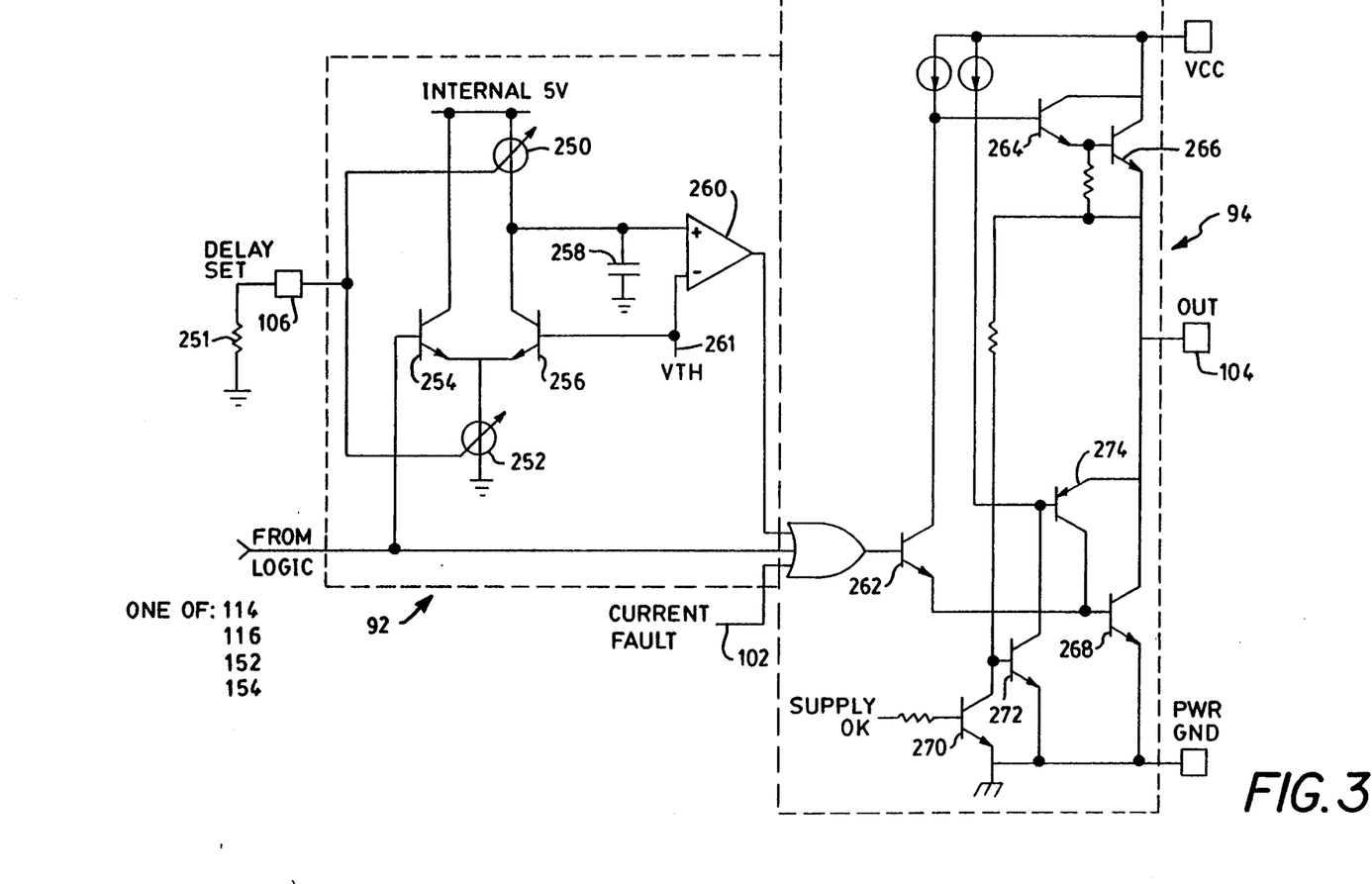
FIG. 3 is a schematic diagram of an embodiment of the output stage of the embodiment of the invention shown in FIG. 2.

Each delay circuit 92, charges and discharges a capacitor 258 with controlled current sources, 250 and 252. The current sources 250,252 are controlled by resistor 251 and are designed such that the current provided by source 252 is twice that of source 250. The delay being on the falling edge of the signal 114, 116, 152, or 154 from the switching logic 112,150 (FIG. 2). During this time, capacitor 258 is discharged from one volt above a reference voltage 261, to $\frac{1}{2}$ volt below the reference voltage 261. The time taken to discharge this capacitor 258 to this voltage level is the delay introduced by this current.

Figure 4:
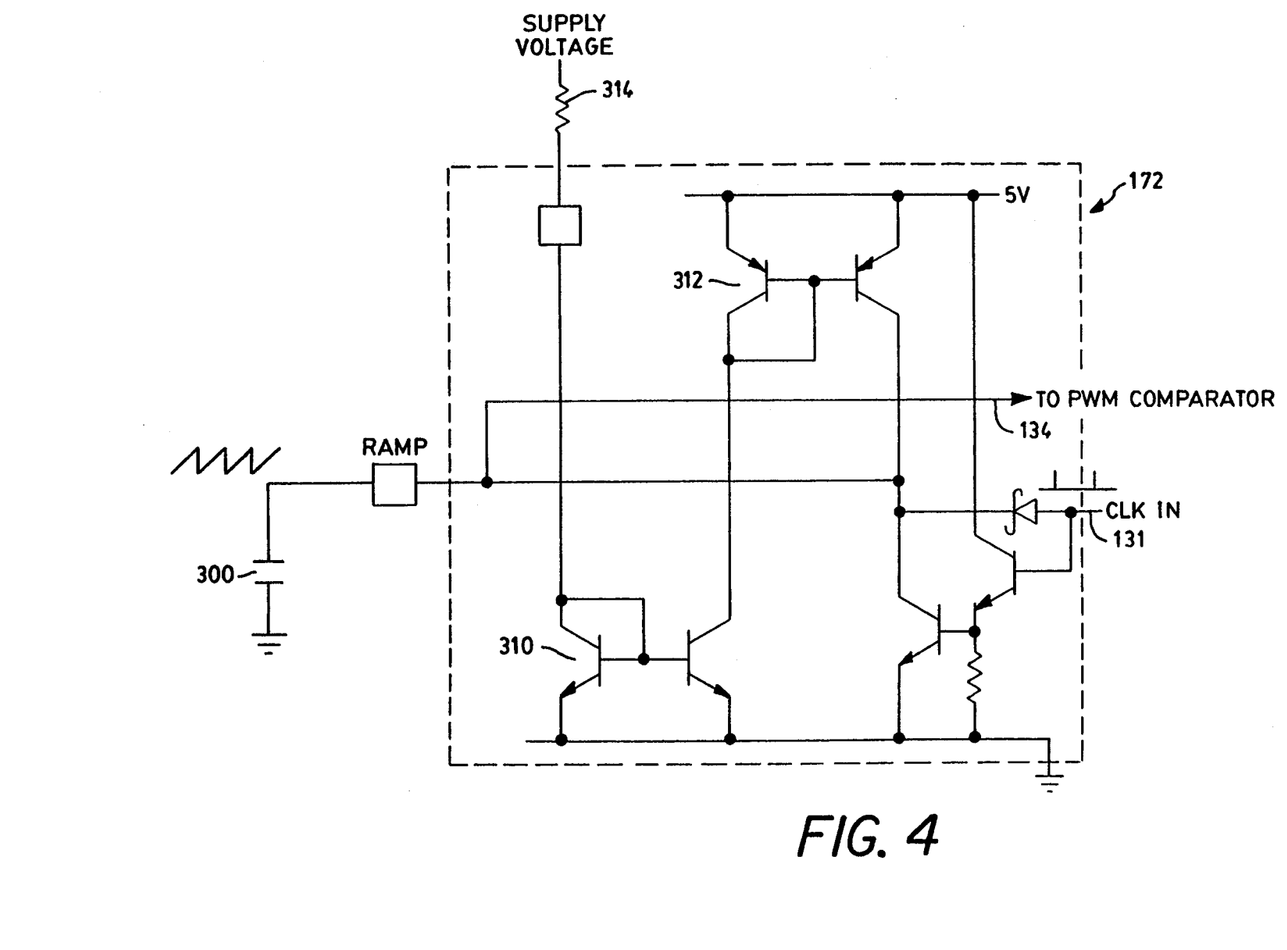
FIG. 4 is a schematic diagram of an embodiment of the ramp generator of the embodiment of the invention shown in FIG. 2.

The ramp generator 172 is shown in detail in FIG. 4. The ramp generator 172 includes a double current mirror 310, 312 which is reset with each clock pulse 132 from the high speed oscillator 130. A resistor 314 connected between the current mirror 310 and a stable voltage source, results in the ramp waveform at capacitor 300 having a constant slope. If the voltage source is variable, the ramp waveform at capacitor 300 will have a variable slope.

Figure 5:
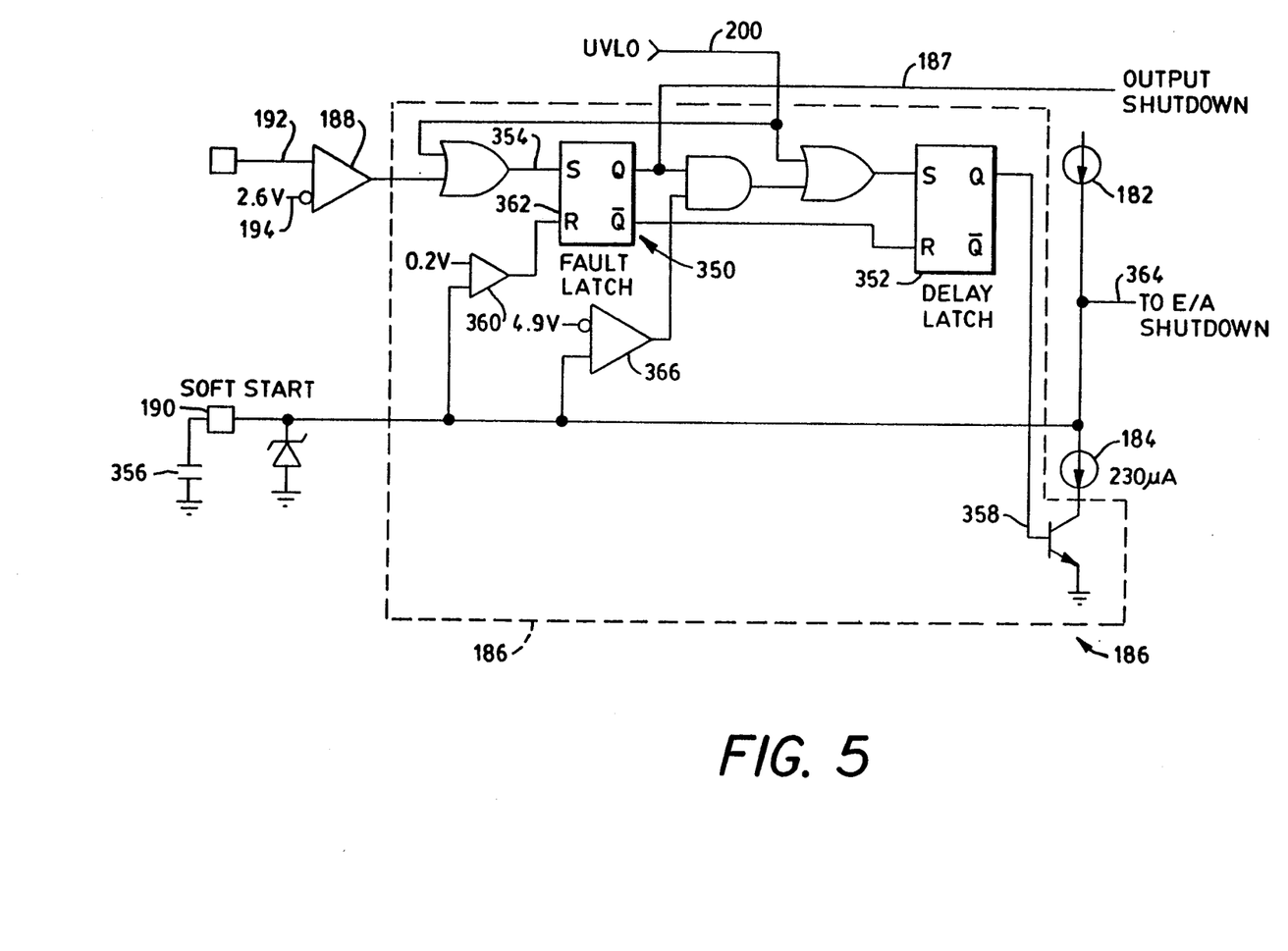
FIG. 5 is a schematic diagram of an embodiment of the fault/soft-start circuit of the embodiment of the invention shown in FIG. 2.

The over-current and soft-start logic circuitry 186 is shown in FIG. 5. The over current and soft-start logic circuit 186 includes a fault latch 350 and a delay latch 352. As discussed previously, the fault latch 350 has its Q-output 187 connected to the NOR-gates 94 of the output stages 90. Therefore, as soon as a fault appears, the signal from the fault comparator 188 to the set input 354 of the latch 350 causes the Q-output 187 of the latch 350 immediately to shut off the output stages 90. As discussed previously, the fault latch 350 prevents the output signal 187 from being removed immediately once the fault signal on the set input 354 is removed. The setting of the fault latch 350 also causes the delay latch 352 to reset, turning on a transistor 358 and causing a soft start capacitor 356 to discharge.

When the voltage on the soft-start capacitor 356 reaches 0.2V, a signal from a start comparator 360 connected to the reset input 362 of the fault latch 350 causes the fault latch 350 to reset, thereby causing the delay latch 352 to reset, shutting off transistor 358. When the voltage on the soft start capacitor reaches 4.9V, a delay start comparator 366 causes the delay latch 353 to discharge and recharge again. The delay start comparator 366 assures a sufficient delay between the elimination of a fault and the restarting of the system.

The result of the termination of a fault condition and the soft-starting of the system (the turning on of the system in a controlled manner) are similar. The soft start capacitor 356 is discharged either because the system has not yet been started or because the soft-start capacitor 356 has been discharged by the turning on of transistor 358 in response to a fault. The lack of voltage on the soft-start capacitor 356 results in the output 364 of the over current and soft-start circuitry 186 being set low. This causes output 136 of the error amplifier 178 to go low resulting in the conditions necessary for zero pulse width modulation. As the soft-start capacitor 356 slowly charges, the signal to the error amplifier 178 slowly increases leading to a controlled increase in the pulse width modulation.

It should also be noted that the supply voltage 212 is compared to a set voltage 210 by an under-voltage lock-out comparator 208. The comparator 108 generates an under voltage lock-out signal (UVLO) when the source voltage 212 is less than the set voltage 210. This under voltage lock out signal 200 is an input signal to the over-current and soft-start logic 186 by way of the delay latch 252. When the system is first powered on, the UVLO signal 200 causes the delay latch 352 to set, permitting the soft-start capacitor 356 to cycle as previously discussed.

Other embodiments are possible which will fall within the scope of the claims, and it is therefore the intention to limit the invention only by the scope of the claims.

What is claimed is:

1. A phase shifted controller for resonantly switching a dc-to-dc converter comprising a first half-bridge comprising a first switch and a second switch and a second-half bridge comprising a third switch and a fourth switch, said first half-bridge and said second half-bridge in communication with a primary of a transformer, said phase shifted controller comprising:
   (a) an oscillator having an output port wherein said oscillator provides a clock signal on the output port;
   (b) a pulse width modulator circuit having a first input coupled to the output port of said oscillator, having a second input port and having an output port;
   (c) an error amplifier having a first input port coupled to an input of the phase shifted controller, having a second input port coupled to a first reference potential, and having an output port coupled to the second input port of said pulse width modulator circuit, wherein said error amplifier provides an error signal to the second input port of said pulse width modulator circuit;
   (d) a switching circuit having a first input port coupled to the output port of said oscillator and having first and second output ports;
   (e) a first logic circuit having a first input port coupled to the first output port of said switching circuit, having a second input port coupled to the output port of said pulse width modulator circuit, and having an output port;
   (f) a first plurality of output stages each of said output stages having an input port, an output port and a delay control port wherein the input port of a first one of said first plurality of output stages is coupled to the first output port of said first switching circuit and the input port of a second one of said first plurality of output stages is coupled to the second output port of said switching circuit and wherein the delay control port receives a control signal for delaying the switching of its respective output stage, wherein each of said first plurality of output stages comprises:
      (i) a time delay circuit having a first input port coupled to the first input port of the corresponding output stage, having a second input port coupled to the corresponding delay control port and having an output port; and
      (ii) an output stage logic circuit having a first input coupled to the first input port of the corresponding output stage, having a second input port coupled to the output of said corresponding time delay circuit, and having an output port coupled to a corresponding one of said first, second, third and fourth switches;
   (g) a second plurality of output stages, wherein each of said second plurality of output stages comprises:
      (i) a time delay circuit having a first input port coupled to a first input port of the corresponding output stage, having a second input port coupled to the corresponding delay control port and having an output port; and
      (ii) an output stage logic circuit having a first input coupled to a first input port of the corresponding output stage, having a second input port coupled to the output of said time delay circuit, and having an output port coupled to a corresponding one of said first, second, third and fourth switches;
   (h) a first signal path coupled between the output port of said first logic circuit and a first input port of a first one of the second plurality of output stages; and
   (i) a second signal path coupled between said first logic circuit and a first input port of a second one of said second plurality of output stages.

2. The phase shifted controller of claim 1 wherein:
   wherein the time delay circuit in the first and second ones of said first plurality of output stages receive, at their respective input ports, input signals having complimentary logic voltages; and
   wherein the time delay circuit in the first and second ones of said second plurality of output stages receive at their respective input ports, input signals having complimentary logic voltages.

3. The phase shifted controller of claim 2 wherein said pulse width modulator circuit comprises:
   (i) a ramp circuit having an input port coupled to the output port of said oscillator and having an output port coupled to a first terminal of a voltage offset source;
   (ii) a first pulse width modulator comparator having a first input port coupled to a second terminal of said reference potential source, having a second input port coupled to the output port of said error amplifier and having an output port;
   (iii) a second pulse width modulator comparator having a first input coupled to the output port of said error amplifier, having a second input port coupled to a first reference potential, and having an output port;
   (iv) a first logic circuit having a first input port coupled to the output port of said oscillator, having a second input port coupled to the output port of said first pulse width modulator comparator and having an output port;
   (v) a second logic circuit having a first input port coupled to the output port of said oscillator, having a second input port coupled to the output port of said second pulse width modulator comparator and having an output port wherein the first input port of said first and second logic circuits receive signals having complimentary logic values; and
   (vi) a pulse width modulator latch circuit having a first input port coupled to the output port of said first logic circuit, having a second input port coupled to the output port of said second logic circuit, and having an output port coupled to the output port of said pulse width modulation circuit.

4. The phase shifted controller of claim 3 further comprising:
   a start up/default circuit having an input port and an output port, with the input port of said start up/default circuit coupled to an output port of said error amplifier; and
   wherein each of said plurality of output stage logic circuits further comprise a third input port coupled to the output port of said start up/default circuit.

5. The phase shifted controller of claim 3 wherein said pulse width modulator latch circuit is provided as a flip-flop.

6. An output stage having a delay set port, a control signal port and an output port and adapted for use with a phase shifted controller for resonantly switching a dc-to-dc converter, said output stage comprising:
   (a) a delay circuit for providing a time delay, said delay circuit having a delay set port, a control signal port, an input voltage terminal and an output port, and said delay circuit comprising:
      a first controlled current source;
      a second controlled current source;
      a switching circuit having a first port coupled to the first controlled current source, having a second port coupled to the second controlled current source, having a first control port coupled to the control signal port and having a second control port coupled to the input voltage terminal;
      a charging circuit coupled to the first port of said switching circuit; and
      a comparator having a first input port coupled to the second port of said switching circuit, a second input port coupled to the input voltage terminal and a first output port coupled to the output port of said delay circuit;
   (b) a control resistor having a first electrode coupled to a first reference potential and having a second electrode coupled to each of said first and second controlled current sources wherein the amount of current provided by each of said first and second controlled current sources corresponds to the resistance value of said control resistor;
   (c) a logic circuit having an input port coupled to the output port of said delay circuit, an output port, a first reference voltage terminal, a second reference voltage terminal and a third reference voltage terminal, said logic gate comprising:
      a logic gate having an input port coupled to the input port of said logic gate and having an output port;
      a totem-pole transistor circuit having an input port coupled to the output port of said logic circuit, said totem-pole transistor circuit for sourcing, in a first stage, a first predetermined amount of current within a predetermined amount of time and for sinking, in a second state, a second predetermined amount of current within a second predetermined amount of time;
      a driver circuit coupled to said totem-pole transistor circuit, wherein said driver circuit biases said totem-pole transistor circuit into its first and second states and wherein said totem-pole transistor circuit is biased into its first state by said driver circuit in response to a first one of the following conditions:
         (1) a power supply voltage coupled to said third reference voltage terminal is below a turn-on threshold voltage; and
         (2) a current fault signal is detected by said logic gate; and
      wherein said delay circuit receives, on the control signal port, a control signal wherein during a falling edge of the control signal the charging circuit is discharged from a first predetermined threshold reference potential to a second predetermined threshold reference potential and wherein the time required to discharge the charging circuit from the first threshold reference potential to the second threshold reference potential corresponds to the time delay provided by said delay circuit and wherein in response to the power supply voltage reaching the turn-on threshold voltage, the totem-pole transistor circuit is biased into its second stage, thereby permitting an output signal having a first signal level to be provided to the logic circuit output port.

7. The circuit of claim 6 wherein:
   said switching circuit comprises:
      a first transistor having first, second and third electrodes, wherein a first one of said electrodes is coupled to a first reference potential, a second one of said electrodes is coupled to the control signal port of said delay circuit and a third one of said electrodes is coupled to the second current source; and
      a second transistor having first, second and third electrodes, wherein a first one of said electrodes is coupled to said first current source, a second one of said electrodes is coupled to the input voltage terminal of said delay circuit and a third one of said electrodes is coupled to the second current source;
   said totem-pole transistor circuit comprises:
      a first transistor having a first electrode coupled to the first reference voltage terminal, a second electrode coupled to the output port of said logic circuit and a third electrode;
      a second transistor having a first electrode coupled to the first reference voltage terminal, a second electrode coupled to the third electrode of said first transistor and a third electrode;
      a third transistor having a first electrode coupled to the third electrode of said second transistor, a second electrode and a third electrode coupled to the output port of said logic gate; and
      a fourth transistor having a first electrode coupled to the logic circuit output port, a second electrode coupled to the second reference voltage terminal and a third electrode coupled to the second electrode of said third transistor of said totem-pole transistor circuit, wherein in response to the power supply voltage reaching the turn on value, the fourth transistor is biased into a state to permit the output signal having the first signal level to be provided to the logic circuit output port; and
   said driver circuit comprises:
      a first transistor having a first electrode coupled to the logic circuit output port, a second electrode coupled to the third electrode of said fourth transistor of said totem-pole transistor circuit and a third electrode;

a second transistor having a first electrode coupled to the third electrode of said first transistor of said driver circuit, a second electrode coupled to the second reference voltage terminal and a third electrode; and a third transistor having a first electrode coupled to the third electrode of the second transistor of said driver circuit, a second electrode coupled to the second reference potential and a third electrode coupled to a third reference voltage terminal.

8. The circuit of claim 7 wherein said charging circuit is provided as a capacitor.

9. An output stage circuit of a phase shifted controller, said output stage circuit comprising:

(a) a delay circuit, said delay circuit comprising:

a control resistor having a first electrode coupled to a first reference potential and a second electrode couple to a second reference potential;

a first controlled current source having a control port coupled to the second electrode of said control resistor;

a second controlled current source having a control port coupled to the second electrode of said control resistor, wherein the amount of current provided by said first and second current sources corresponds to the resistance value of said control resistor and wherein said first and second current sources are provided such that the current provided by the second current source corresponds to twice that of the first current source;

a charging circuit coupled between said first and second controlled current sources wherein said first and second controlled current sources, respectively charge and discharge the charging circuit; and (b) a logic circuit, having an input port, an output port, a first reference voltage terminal said logic circuit comprising:

a totem-pole circuit for sourcing, in a first state, more a first predetermined amount of current within a predetermined amount of time and for sinking, in a second state, more than one ampere of current within a predetermined amount of time, said totem-pole circuit comprising:

a first transistor having a first electrode coupled to the first reference voltage terminal, a second electrode coupled to the output port of said logic circuit and a third electrode;

a second transistor having a first electrode coupled to the first reference voltage terminal, a second electrode coupled to the third electrode of said first transistor and a third electrode;

a third transistor having a first electrode coupled to the third electrode of said second transistor, a second electrode and a third electrode coupled to the output port of said logic circuit and a fourth transistor having a first electrode coupled to the logic circuit output port, a second electrode coupled to the second reference voltage terminal and a third electrode coupled to the second electrode of said third transistor of said totem-pole transistor circuit, wherein in response to the power supply voltage reaching the turn on value, the fourth transistor is biased into a state to permit the output signal having the first signal level to be provided to the logic circuit output port;

a self-biasing driver circuit comprising:

a first transistor having a first electrode coupled to the logic circuit output port, a second electrode coupled to the third electrode of said fourth transistor of said totem-pole transistor circuit and a third electrode;

a second transistor having a first electrode coupled to the third electrode of said first transistor of said driver circuit, a second electrode coupled to the second reference voltage terminal and a third electrode; and a third transistor having a first electrode coupled to the third electrode of the second transistor of said driver circuit, a second electrode coupled to the second reference potential and a third electrode coupled to a third reference voltage terminal, wherein the fourth transistor of said totem-pole transistor circuit is biased into its conduction state by said driver circuit in response to a first one of the following conditions:

(1) the power supply voltage is below its turn-on threshold; and (2) a current fault signal is detected by said totem-pole transistor circuit; and wherein said delay circuit receives a control signal and wherein during a falling edge of the control signal the charging circuit is discharged from a first predetermined threshold reference potential to a second predetermined threshold reference potential and wherein the time taken to discharge the charging circuit from the first reference voltage to the second reference voltage corresponds to the time delay and wherein in response to the power supply voltage reaching a turn-on value, the fourth transistor of said totem pole circuit is biased into its nonconduction state, thereby permitting an output signal having a first signal level to be provided to the logic circuit output port.

10. The output stage circuit of claim 9 wherein said charging circuit is provided as a capacitor having first and second terminals and said delay circuit further comprises:

a comparator having a first input port coupled the first terminal of said capacitor, a second input port coupled to the reference voltage and an output port coupled to the logic circuit input port, wherein when the capacitor voltage is greater than the reference voltage, said comparator provides an output signal having a first voltage level to said logic circuit input port and wherein when the capacitor voltage is less than the reference voltage, said comparator provides an output signal having a second different voltage level to the input port of said logic circuit.

11. The output stage circuit of claim 10 wherein:

the first predetermined threshold reference potential corresponds to a voltage level typically of about one volt above the reference voltage; and the second predetermined threshold reference potential corresponds to a voltage level typically of about one-half volt below the reference voltage.

* * * * *

UNITED STATES PATENT AND TRADEMARK OFFICE
CERTIFICATE OF CORRECTION

PATENT NO. : 5,291,384
DATED : March 1, 1994
INVENTOR(S) : Robert A. Mammano, et al It is certified that error appears in the above-indentified patent and that said Letters Patent is hereby corrected as shown below:

Column 8, line 52-53, "latch 353 to discharge and recharge again." should read --latch 353 to set again, permitting the soft-start capacitor 356 to discharge and recharge again.--.

Column 9, line 5, "108" should read --208--.

Column 11, line 57, "stage" should read --state--.

Column 12, line 18, "stage" should read --state--.

Signed and Sealed this

Sixth Day of September, 1994

Attest:

BRUCE LEHMAN

Attesting Officer     Commissioner of Patents and Trademarks